United States Patent [19]

Wang et al.

[11] 4,183,035

[45] Jan. 8, 1980

[54] INVERTED HETEROJUNCTION PHOTODIODE

[75] Inventors: Cheng-Chi Wang; John G. Pasko; Joseph T. Longo, all of Thousand Oaks; John E. Clarke, Newbury Park, all of Calif.

[73] Assignee: Rockwell International Corporation, El Segundo, Calif.

[21] Appl. No.: 919,022

[22] Filed: Jun. 26, 1978

[51] Int. Cl.² ............................................. H01L 27/14
[52] U.S. Cl. ........................................ 357/30; 357/16; 357/61; 148/175
[58] Field of Search ........................... 357/30, 16, 61; 148/175

[56] References Cited

U.S. PATENT DOCUMENTS

| | | | |
|---|---|---|---|
| 4,021,836 | 5/1977 | Andrews | 357/30 |
| 4,048,535 | 9/1977 | Cox | 313/367 |
| 4,053,919 | 10/1977 | Andrews | 357/30 |
| 4,064,621 | 12/1977 | Lo | 29/569 L |
| 4,075,043 | 2/1978 | Clarke | 148/171 |
| 4,080,723 | 3/1978 | Holloway | 29/584 |

*Primary Examiner*—Martin H. Edlow
*Attorney, Agent, or Firm*—L. Lee Humphries; Craig O. Malin

[57] ABSTRACT

A low-leakage, heterojunction photodiode for use as a detector sensitive to infrared radiation is provided. The diode structure comprises a PbTe substrate of n-type conductivity with an n-type epitaxial buffer layer on the substrate and an epitaxial active layer on the buffer layer. The buffer layer is either $Pb_{(1-x)}S_xTe$ or $Pb_{1-x}Se_xTe$ with the atomic fraction of S or Se, x, being greater than 0 but less than 0.1. The active layer is $Pb_{1-y}Sn_yTe$ with the atomic fraction of Sn, y, being greater than 0 but less than 0.3. There is a p-n junction created in the active layer with the n side of the junction being adjacent the buffer layer. Metal is deposited on the substrate and on the active layer to provide electrical contact to the diode.

5 Claims, 3 Drawing Figures

INVERTED HETEROJUNCTION PHOTODIODE

STATEMENT OF GOVERNMENT INTEREST

The Invention herein described was made in the course of or under a contract or subcontract thereunder, (or grant) with the Department of Defense.

BACKGROUND OF THE INVENTION

1. Field of the Invention

This invention relates to the field of solid state electronics and particularly to the field of solid state photodiodes for detecting infrared energy.

2. Description of the Prior Art

The performance of photodiodes is reduced by leakage current which can be considered to be a parastic current flowing in parallel with the desirable photocurrent. Leakage current is made up of bulk current and excess current (surface current) and the amount and contribution of these currents to the total leakage current varies with temperature as described in INVESTIGATIONS OF LEAKAGE CHARACTERISTICS OF PbSnTe-PbTe INVERTED HETEROSTRUCTURE DIODES by Wang, Kalisher, Tracy, Clarke, and Longo, *SOLID STATE ELECTRONICS*, 1978, vol. 21, pp. 625-632.

Photodiodes for 8-14 μm infrared detection have been fabricated using PbSnTe semiconducting material. One such photodiode is described in U.S. Pat. No. 4,021,836. Although such prior art photodiodes are capable of high performance, there is a continuing need to decrease the leakage and improve the efficiency and performance of photodiodes.

SUMMARY OF THE INVENTION

It is an object of the invention to provide a more efficient photodiode for use in infrared detection.

It is an object of the invention to provide a low-leakage, infrared photodiode.

It is an object of the invention to provide an improved photodiode for 8-14 μm infrared detection.

According to the invention, a low-leakage, heterojunction photodiode for use as a detector sensitive to infrared radiation is provided. The diode structure comprises a PbTe substrate of n-type conductivity with an n-type epitaxial buffer layer on the substrate and an epitaxial active layer on the buffer layer. The buffer layer is either $Pb_{(1-x)}S_xTe$ or $Pb_{1-x}Se_xTe$ with the atomic fraction of S or Se, x, being greater than 0 but less than 0.1. The active layer is $Pb_{1-y}Sn_yTe$ with the atomic fraction of Sn, y, being greater than 0 but less than 0.3. There is a p-n junction created in the active layer with the n side of the junction being adjacent the buffer layer. Metal is deposited on the substrate and on the active layer to provide electrical contact to the diode.

In a preferred embodiment, an array of inverted mesa photodiodes are formed on a single substrate to create a focal plane for IR imaging.

These and other objects and features of the present invention will be apparent from the following detailed description, taken with reference to the accompanying drawings.

DESCRIPTION OF THE PREFERRED EMBODIMENT

Figure 1:
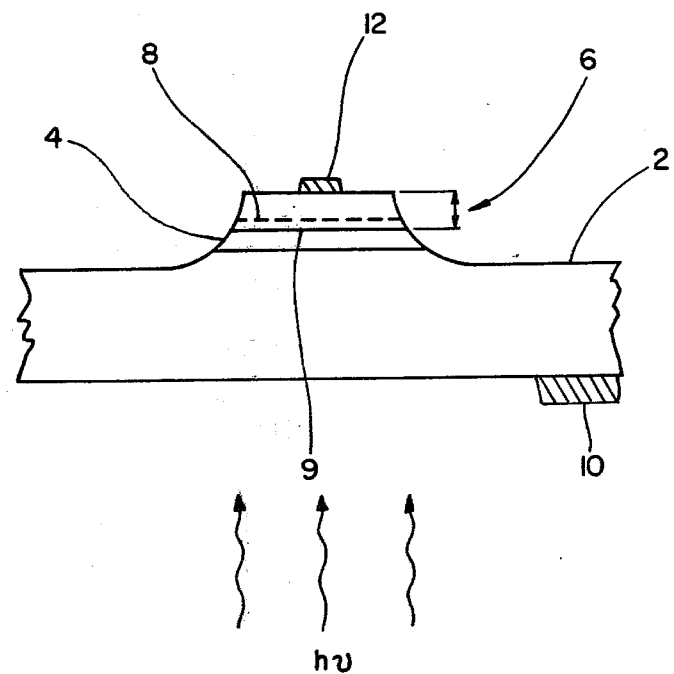
FIG. 1 is a schematic of a single photodiode according to the invention.

FIG. 1 illustrates the basic structure of a single photodiode according to the invention. Substrate 2 is n-type PbTe obtained by a seeded closed-tube vapor transport technique known in the industry. The carrier concentration of the PbTe substrate is on the order of $1 \times 10^{17}/cm^3$ which makes it transparent to photons byoend ~6 μm with negligible free carrier absorption, ($\alpha < 5$ cm$^{-1}$ at 10 μm). Substrate wafers are cut from a PbTe boule in the (100) plane to within 1°. Standard polishing and cleaning procedures are used to prepare the wafers prior to LPE growth.

A buffer layer 4 of n-type $Pb_{(1-x)}S_xTe$ or $Pb_{(1-x)}Se_xTe$ is grown by transient liquid phase epitaxy, LPE, growth technique on top of substrate 2. The atomic fraction of sulfur or selenium, x, can range from a value greater than 0 to 0.1, ($0 < x < 0.1$) with the balance, $1-x$, being lead. The actual atomic fraction of sulfur or selenium used for a particular photodiode is selected to make the buffer layer non-absorbing (transparent) to the particular wavelength being detected and to reduce the lattice mismatch between buffer layer 4 and active layer 6.

Buffer layer 4 is grown on top of substrate 2 at a growth temperature of approximately 530° C. with a constant dropping rate of 1° C./min. The nominal thickness of buffer layer 4 is about 10 μm, resulting in a growth rate of ~0.5 μm/°C. Active layer 6 comprises $Pb_{(1-y)}Sn_yTe$, and is grown on buffer layer 4 utilizing a similar transient LPE growth technique. A growth temperature of approximately 510° C. with a constant dropping rate of 1° C./min. is used to obtain a layer approximately 10 μm thick. The as-grown surface is mirror-like with minimum meniscus lines.

The actual atomic fraction, y, of tin in active layer 6 can range from greater than 0 to less than 0.3 ($0 < y < 0.3$) in order to make the active layer absorbing (non-transparent) to the particular wavelength being detected. As is known in the art, the spectral response of a photodiode depends upon the bandgap energy of the active layer. The bandgap energy, in turn, depends upon the temperature of operation and upon the amount of tin in the PbSnTe layer. For example, at 85° K. and for a composition of $Pb_{0.8}Sn_{0.2}Te$ (y=0.2), the photodiode has a peak response for 10.5 μm radiation.

An important feature of the invention is the creation of electrical (p-n) junction 8 within active layer 6 or in heterojunction 9 between the active and buffer layers rather than in buffer layer 4. Active layer 6 is normally all p-type material and p-n junction 8 is normally in the buffer layer side of heterojunction 9. However, by annealing the layers at approximately 450° C. for about 20 hours, electrical junction 8 is moved out of buffer layer 4 and into heterojunction 9 or across heterojunction 9 into active layer 6.

The fact that electrical junction 8 is located within active layer 6 or in heterojunction 9 increases the efficiency of the photodiode because, as a result of diffusion, there are fewer majority carriers in this region than in buffer layer 4. Additionally, the location of junction 8 outside of buffer layer 4 enables the diode to operate efficiently in the portion of the infrared spectrum for which active layer 6 is responsive, as discussed above.

Metal deposits 10, 12 are provided on substrate 2 and on active layer 6 for biasing the photodiode and for measuring the photocurrent. As shown in FIG. 1, radiation hv comes through transparent substrate 2, and thus FIG. 1 is an example of an inverted structure. However, the invention can be applied to other orientations of the basic structure.

Table I shows some average properties for photodiodes having different tin content in the active layer, and thus having different spectral response.

TABLE I

Properties of Two Photodiodes Having Different Tin Content in the Active Layer

|  | $Pb_{.8}Sn_{.2}Te$ | $Pb_{.76}Sn_{.24}Te$ |
|---|---|---|
| Spectral Peak at 85° K. | 10.5 μm | 13 μm |
| 50% cut-off at 85° K. | 11.5 μm | 14.2 μm |
| $R_oA$ | 2.2Ω-cm² at 92° K. | .7Ω-cm² at 85° K. |
| Quantum Efficiency | ~ 40% at 92° K. | ~ 30% at 85° K. |

Figure 2:
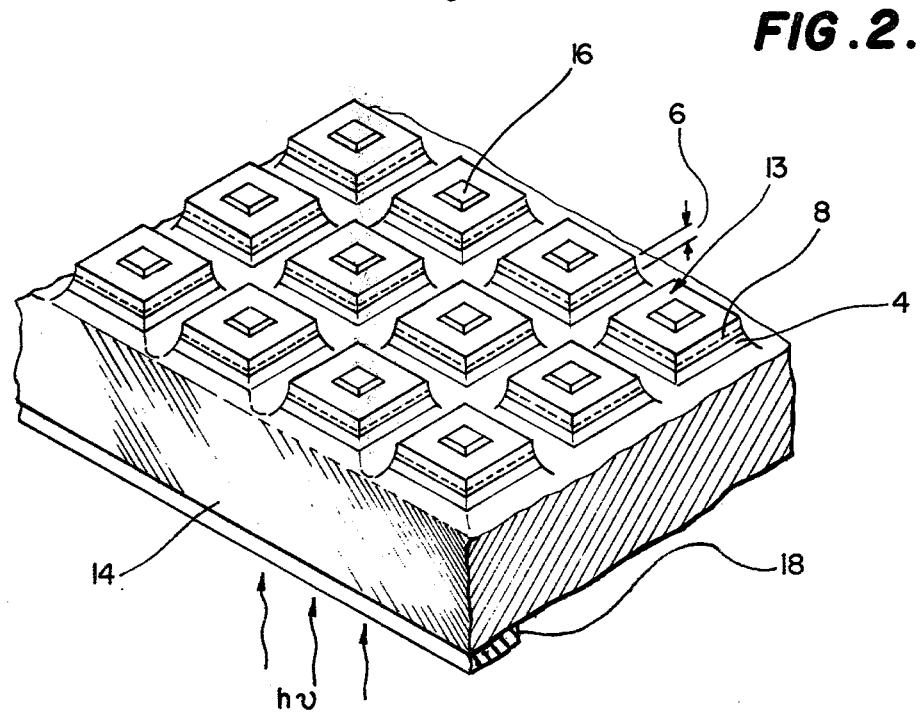
FIG. 2 is a schematic of an IR focal plane formed by an array of photodiodes such as shown in FIG. 1.

FIG. 2 shows an array of mesa photodiodes 13 on a single substrate forming an infrared focal plane. Electrical contact is made to each photodiode 13 and to substrate 14 by metal deposits 16, 18. Each photodiode has buffer layer 4, active layer 6, and electrical junction 8 as previously described. Mesa diodes 13 are delineated by a standard photolithographic technique, and the mesa tops are metallized with ohmic contacts 16 to the p-type PbSnTe active layer 6. Thousands of diodes 13 can be delineated on a single substrate utilizing center-to-center spacing of approximately 4 mil or less.

Figure 3:
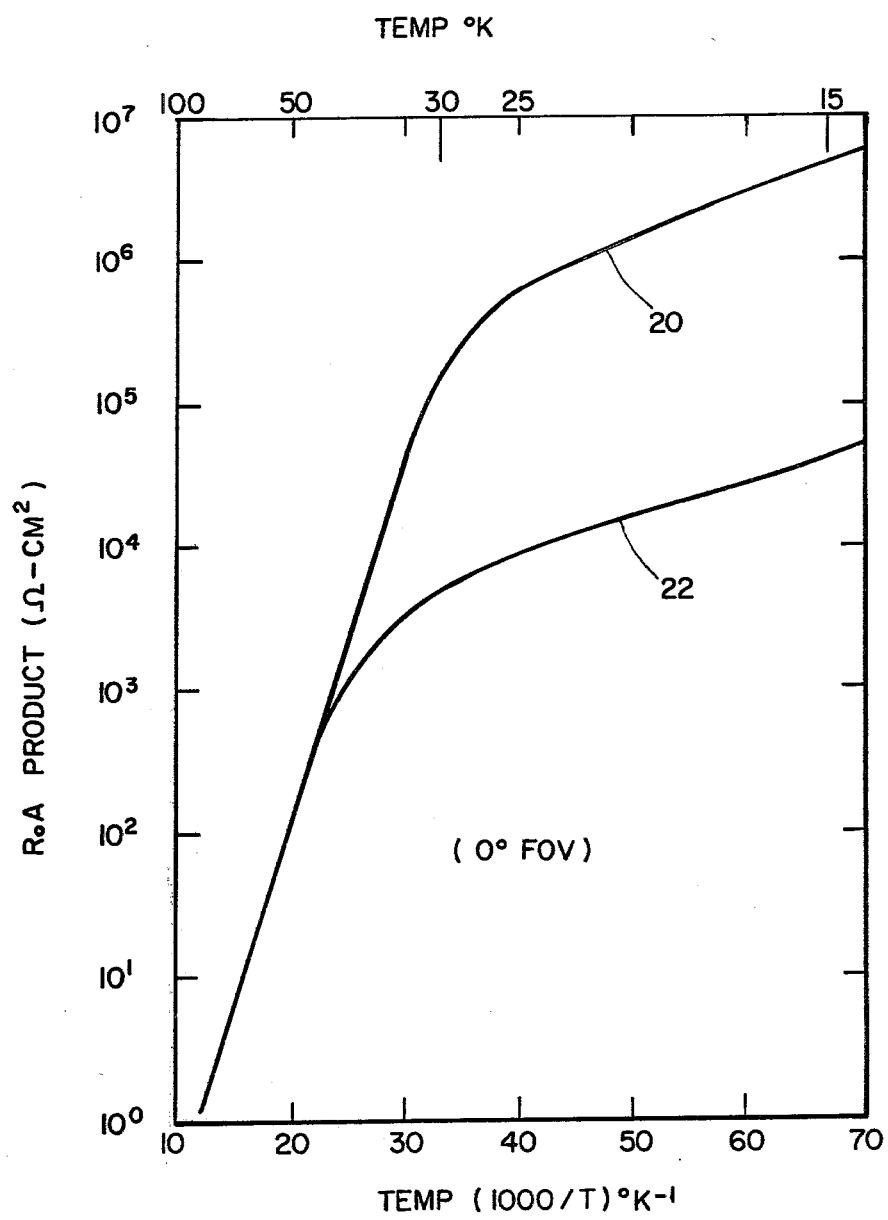
FIG. 3 is a plot of impedance as a function of temperature under zero bias for a prior art diode and for a diode according to the invention.

FIG. 3 is a plot of impedance (resistance×area product) as a function of temperature for a mesa photodiode structure 20 according to the present invention, and for a comparable mesa photodiode structure 22 according to the prior art (a PbTe substrate, and PbSnTe buffer and active layers). Curves 20, 22 are plotted against the reciprocal of temperature (1000/T) to better illustrate the mathematical relationship. The upper abcissa shows directly the corresponding temperature. The curves were obtained at zero bias. The impedance of photodiode 20 is higher than for prior art diode 22 at temperatures below 40° K. At these low temperatures, the leakage is predominantly surface current rather than bulk current. Therefore, the higher impedance exhibited by photodiode 20 is indicative of its higher surface resistance at temperatures below 40° K.

The exact origin of the surface leakage is not known in these mesa diodes. The surface of the diode after mesa delineation is likely covered by an oxide layer which, in turn, absorbs gas atoms and molecules in the air. The charges on the surface will then induce image charges in the semiconductor and consequently lead to the formation of a surface depletion region. The generation current in the surface depletion layer thus contributes to a surface leakage current component. An additional surface generation current also exists which is due to generation—recombination centers at the PbSnTe-oxide interface.

As shown in FIG. 3, photodiode 20 has significantly lower leakage than photodiode 22 of the prior art. It appears that the S or Se passivates the sides of the diode, greatly increasing the surface resistance and thus reducing the surface leakage current. In any event, total leakage is reduced by the use of a PbSTe or PbSeTe buffer layer resulting in photodiodes of improved performance.

Numerous variations and modifications may be made without departing from the present invention. Semiconducting devices other than photodiodes can be fabricated according to the invention. For example, the structure can be operated as a light-emitting diode (LED) for generating radiation of a particular wavelength rather than receiving such radiation as a photodiode. Accordingly, it should be clearly understood that the form of the present invention described above and shown in the accompanying drawings is illustrative only and is not intended to limit the scope of the present invention.

What is claimed is:

1. A semiconducting device comprising:
    a substrate comprising a PbTe crystal of n-type conductivity;
    an epitaxial buffer layer of $Pb_{(1-x)}X_xTe$ of n-type conductivity on said substrate, wherein X is a Group VI element selected from the group consisting of S and Se and wherein x is a value greater than 0 but less than 0.1;
    an epitaxial active layer of $Pb_{(1-y)}Sn_yTe$ on said buffer layer, wherein y is a value greater than 0 but less than 0.3, said active layer forming a heterojunction between said active layer and said buffer layer;
    a p-n junction located outside said buffer layer in either said active layer or in said heterojunction, the n side of said p-n junction being adjacent said buffer layer; and
    electrical contact means coupled to said substrate and to said active layer.

2. A focal plane comprising:
    a plurality of mesa photodiodes on a PbTe substrate of n-type conductivity, and wherein each of said mesa diodes comprises:
    an epitaxial buffer layer of $Pb_{(1-x)}X_xTe$ of n-type conductivity on said substrate, wherein X is a Group VI element selected from the group consisting of S and Se and wherein x is a value greater than 0 but less than 0.1;
    an epitaxial active layer of $Pb_{(1-y)}Sn_yTe$ on said buffer layer, wheren y is a value greater than 0 but less than 0.3, said active layer forming a heterojunction between said active layer and said buffer layer;
    a p-n junction located outside said buffer layer in either said active layer or in said heterojunction, the n side of said p-n junction being adjacent said buffer layer; and
    electrical contact means coupled to said substrate and to said active layer.

3. A photodiode comprising:
    a substrate comprising a PbTe crystal of n-type conductivity;
    an epitaxial buffer layer of $Pb_{(1-x)}S_xTe$ of n-type conductivity on said substrate, wherein x is a value greater than 0 but less than 0.1;
    an epitaxial active layer of $Pb_{(1-y)}Sn_yTe$ on said buffer layer, wherein y is a value greater than 0 but less than 0.3, said active layer forming a heterojunction between said active layer and said buffer layer;
    a p-n junction located outside said buffer layer in either said active layer or in said heterojunction, the n side of said p-n junction being adjacent said buffer layer; and electrical contact means coupled to said substrate and to said active layer.

4. A photodiode comprising:

a substrate comprising a PbTe crystal of n-type conductivity;

an epitaxial buffer layer of $Pb_{(1-x)}Se_xTe$ on n-type conductivity on said substrate, wherein x is a value greater than 0 but less than 0.1;

an epitaxial active layer of $Pb_{(1-y)}Sn_yTe$ on said buffer layer, wherein y is a value greater than 0 but less than 0.3, said active layer forming a heterojunction between said active layer and said buffer layer;

a p-n junction located outside said buffer layer in either said active layer or in said heterojunction, the n side of said p-n junction being adjacent said buffer layer; and electrical contact means coupled to said substrate and to said active layer.

5. A method of fabricating a semiconducting device comprising the steps of:

providing a substrate comprising PbTe crystal of n-type conductivity;

epitaxially growing a buffer layer of $Pb_{(1-x)}X_xTe$ n-type conductivity on said substrate, wherein X is a Group VI element selected from the group consisting of S and Se and wherein x is a value greater than 0 but less than 0.1;

epitaxially growing an active layer of $Pb_{(1-y)}Sn_yTe$ on said buffer layer, wherein y is a value greater than 0 but less than 0.3, said active layer forming a heterojunction between said active layer and said buffer layer;

annealing said substrate, buffer layer, and active layer at approximately 450° C. for approximately 20 hours to form a p-n junction located outside said buffer layer in either said active layer or in said heterojunction, the n side of said p-n junction being adjacent said buffer layer; and depositing electrical contact means coupled to said substrate and to said active layer.

* * * * *